United States Patent
Ho et al.

(10) Patent No.: US 7,279,793 B2
(45) Date of Patent: Oct. 9, 2007

(54) SYSTEM AND METHOD FOR MANUFACTURING SEMICONDUCTOR DEVICES USING AN ANTI-REFLECTIVE COATING LAYER

(75) Inventors: Bang-Ching Ho, Hsin-Chu (TW); Jen-Chieh Shih, Yongkang (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 28 days.

(21) Appl. No.: 11/007,031

(22) Filed: Dec. 8, 2004

(65) Prior Publication Data

US 2006/0118956 A1 Jun. 8, 2006

(51) Int. Cl.
*H01L 21/00* (2006.01)
*H01L 31/0232* (2006.01)

(52) U.S. Cl. ............... 257/758; 257/437; 438/48; 438/72; 438/636; 438/322

(58) Field of Classification Search ............... 257/437, 257/E21.023; 438/48, 72, 636, 322; 430/322
See application file for complete search history.

(56) References Cited

U.S. PATENT DOCUMENTS

| | | | | |
|---|---|---|---|---|
| 5,294,680 | A | * | 3/1994 | Knors et al. ............ 525/327.4 |
| 6,165,684 | A | * | 12/2000 | Mizutani et al. ......... 430/271.1 |
| 2004/0191479 | A1 | * | 9/2004 | Hatakeyama et al. ....... 428/141 |
| 2006/0057507 | A1 | * | 3/2006 | Chang et al. ............... 430/327 |

* cited by examiner

*Primary Examiner*—Jerome Jackson
*Assistant Examiner*—Joseph Nguyen
(74) *Attorney, Agent, or Firm*—Haynes and Boone, LLP

(57) ABSTRACT

An anti-reflective coating layer for the manufacturing of semiconductor devices is disclosed. In one example, a partial semiconductor device includes a substrate; a bottom anti-reflective coating (BARC) layer over the substrate, and the BARC layer is transformed from being hydrophobic to being hydrophilic during a lithography process; and a photoresist layer over the BARC layer.

13 Claims, 3 Drawing Sheets

SYSTEM AND METHOD FOR MANUFACTURING SEMICONDUCTOR DEVICES USING AN ANTI-REFLECTIVE COATING LAYER

BACKGROUND

The present disclosure relates generally to the manufacturing of semiconductor devices, and more particularly to utilizing an anti-reflective coating layer in semiconductor manufacturing.

During the manufacturing of semiconductor devices, substrate topography or non-uniform substrates may cause variations in exposure energy. As a result, certain regions of the photoresist that should be unexposed may become exposed unintentionally, resulting in notching of the photoresist.

One method for reducing such notching is to add non-bleaching dyes to the photoresist. However, such a method possesses a number of shortcomings. First, it may cause unintended resist sidewall angles. Second, in submicron technologies, the required high dye concentration may cause magnified standing wave near the photoresist-substrate interface, resulting in resist scumming.

Another method for reducing notching is to utilize an anti-reflective coating (ARC) layer. As a result, reflection from the substrate may be suppressed by attenuating light that passes through the ARC or by matching the refraction index of the ARC to that of the light. In practice, ARC layers may be deposited either on top of a photoresist layer to form a top anti-reflective coating (TARC) layer, or beneath the photoresist layer to form a bottom anti-reflective coating (BARC) layer.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
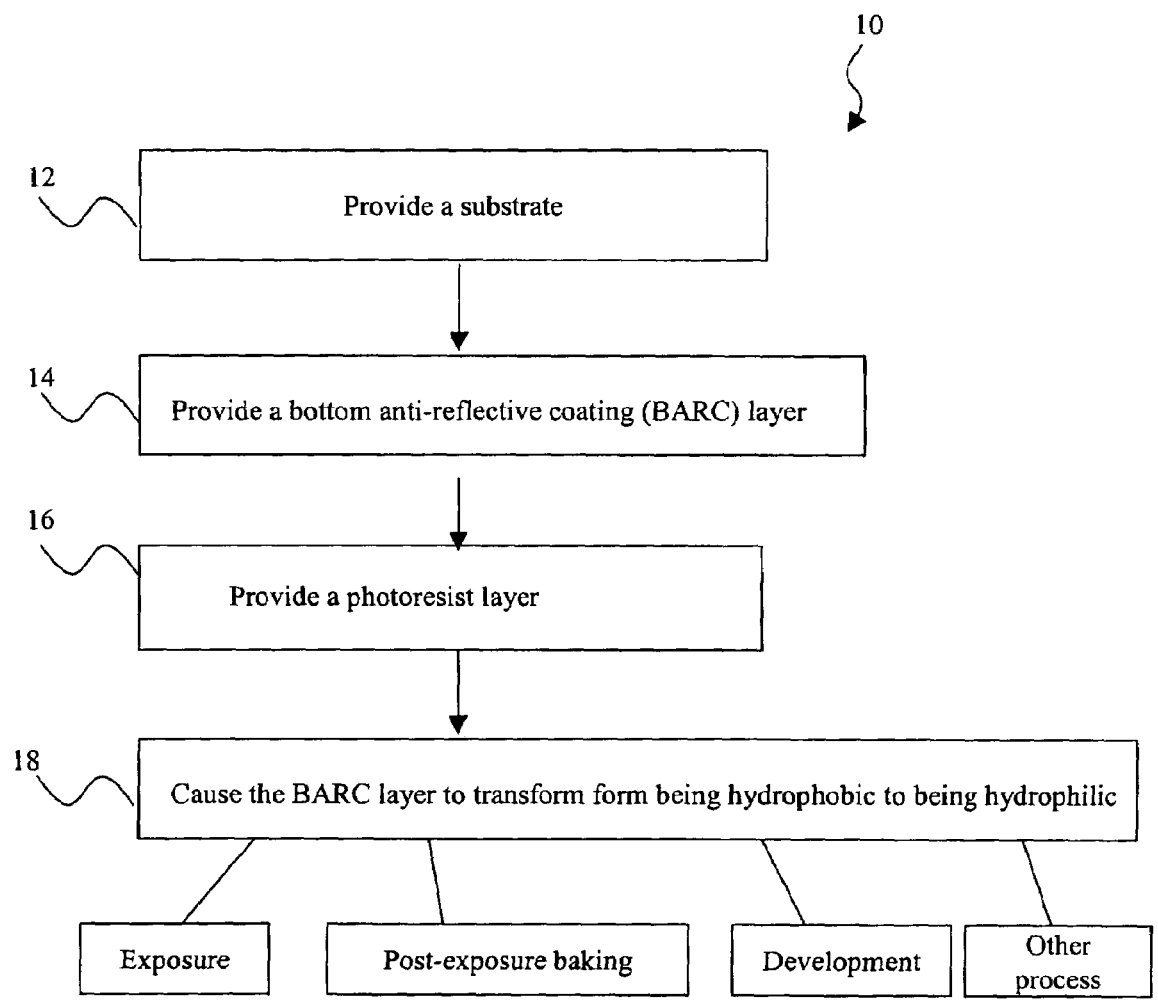
FIG. 1 is method of semiconductor manufacturing for implementing one or more embodiments of the present invention.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Traditionally, a BARC layer is comprised of either a hydrophobic or a hydrophilic material. In each instance, there exist a number of shortcomings. For example, if the BARC layer is comprised of a hydrophobic material, water marks are frequently generated following the development stage, resulting in high defect rates. On the other hand, if the BARC layer is comprised of a hydrophilic material, insufficient adhesion may exist between the BARC layer and the substrate/photoresist layer, causing the BARC layer to separate from the substrate/photoresist layer.

Therefore, what is desired is a new and improved BARC layer.

The improved BARC layer may be transformed from being hydrophobic to being hydrophilic during a semiconductor manufacturing process. The transformation may occur at the exposure, post-exposure baking, development, and/or any other suitable stage. The improved BARC layer and its transformation will be further described in connections with partial semiconductor devices 100 and 200 below.

Referring now to FIG. 1, shown therein is an exemplary method 10 for semiconductor manufacturing. In this embodiment, the method 10 initiates with step 12, which provides a substrate, and a BARC layer is provided pursuant to step 14. Then, pursuant to step 16, a photoresist layer is provided, and the BARC layer is transformed form being hydrophobic to being hydrophilic pursuant to step 18 of the method 10.

The method 10 may be utilized in the manufacturing of a variety of semiconductor devices (with or without the damascene technology), such as memory devices (including but not limited to a static random access memory (SRAM)), logic devices (including but not limited to a metal-oxide semiconductor field-effect transistor (MOSFET)), and/or other devices. The method 10 will be further described in connections with exemplary partial semiconductor devices depicted in FIGS. 2-3.

Figure 2:
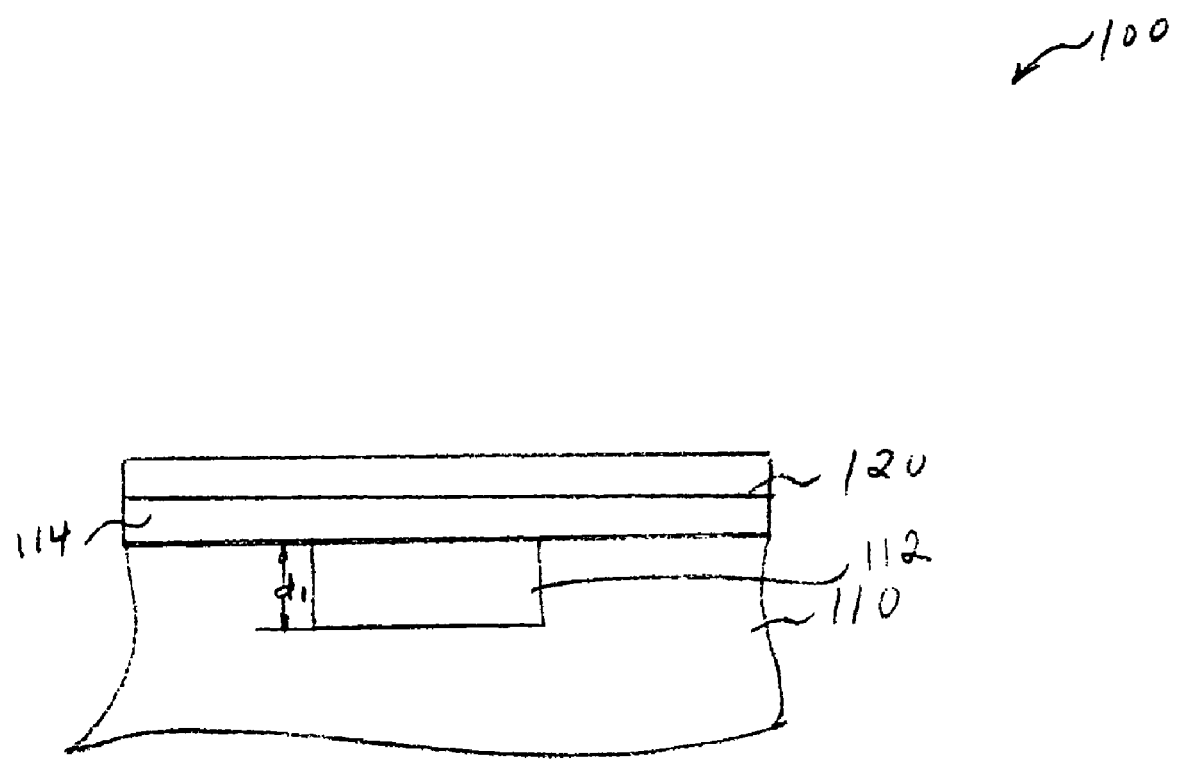
FIG. 2 is a partial semiconductor device for implementing one or more embodiments of the present invention.

Referring now to FIG. 2, shown therein is an exemplary partial semiconductor device 100 that includes a substrate 110, a conductive layer 112, a dielectric layer 114, and a BARC layer 120. The substrate 110 is provide by step 12 of the method 10. The substrate 110 may include one or more insulator, conductor, and/or semiconductor layers. For example, the substrate 110 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 110 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 110 may also or alternatively include a multiple silicon structure or a multilayer compound semiconductor structure.

The conductive layer 112 may be deposited in a recess formed in the substrate 110 by chemical vapor deposition (CVD), plasma-enhanced CVD (PECVD), physical vapor deposition (PVD), ionized PVD (I-PVD), atomic layer deposition (ALD), plating, and/or other processes. Chemical-mechanical planarization and/or chemical-mechanical polishing may also be employed during the formation of the conductive layer 112. For example, the conductive layer 112 may be planarized so that it becomes substantially coplanar with a surface of the substrate 110, as shown in FIG. 2. In another embodiment, planarization of the conductive layer 112 may be less extensive, so that the conductive layer 112 may at least partially extend from the substrate 110 to above the surface of the substrate 110. Characterizations herein of the conductive layer 112 as being formed in the substrate 110 is intended to capture both of those embodiments, in addition to other alternative embodiments.

The conductive layer 112 may be a conductive feature connecting semiconductor devices, integrated circuit devices, integrated circuit components, and/or interconnects therein. A depth d1 of the conductive layer 112 may range between about 1500 Å and about 5000 Å. For example, in one embodiment, the depth d1 may be about 3500 Å. The conductive layer 112 may include aluminum, aluminum alloy, copper, copper alloy, tungsten, and/or other conductive materials.

A dielectric layer 114 may be deposited on the surface of the substrate 110. The dielectric layer 114 may be formed by CVD, PECVD, ALD, PVD, spin-on coating and/or other processes. The dielectric layer 114 may be an inter-metal dielectric (IMD), and may include low-k materials, silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials.

Pursuant to step 14 of the method 10, the BARC layer 120 may be deposited over the dielectric layer 114 by a variety of techniques, including but not limited to spin-on coating, PVD, CVD, and/or other processes.

The BARC layer 120 may serve the function of reducing the intensity reflection coefficient of the substrate 110. In one example, the BARC layer 120 may absorb the light that inadvertently penetrates the bottom of a photoresist layer (not shown). To perform the light absorption, the BARC layer 120 may include a material with a high extinction coefficient, and/or considerable thickness. On the other hand, a high coefficient of the BARC layer 120 may lead to the high reflectivity of the BARC layer, which counters the effectiveness of the BARC layer 120. Accordingly, it is contemplated that the BARC layer 120 may possess a coefficient value at approximately between about 0.2 to about 0.5, and may possess in the range of about 20 nm to about 200 nm. However, it is noted that other ranges of coefficient values and thickness are also contemplated by the present disclosure.

In another example, an index matching approach may be adopted for the BARC layer 120. In that case, the BARC layer 120 may include a material with a refraction index and thickness that match those of the light used a subsequent process. In operation, once the light strikes the BARC layer 120, a portion of the light is reflected therefrom. Meanwhile, another portion of the light enters the BARC layer 120 and is transformed into a light with a shifted phase, which interferes with the first portion of the light that is reflected from the BARC layer 120, resulting in the reduction of the light reflectivity.

It is contemplated that the BARC layer 120 may employ both the light absorption and index matching approaches to achieve the desired results. In some instances, the BARC layer 120 may simply remain over the dielectric layer 114 and serve as a diffusion barrier for the partial semiconductor device 100, as the removal of the BARC layer 120 may be difficult to accomplish.

The BARC layer 120 may include organic or inorganic materials. In one embodiment, the BARC layer 120 may include one or more materials, such as TiN, silicon oxynitride, silicon nitride and/or any suitable materials procured from suppliers such as Hitachi, Shipley, Brewer Science, Clariant, and Tokyo Ohka.

Initially, when the BARC layer 120 is deposited over the dielectric layer 114, it is hydrophobic. In one example, the BARC layer 120 may include one or more hydrolyzable monomers, such as maleic ahhydride, a lactone derivative, and/or other suitable components. As described below, the hydrolyzable monomer may undergo a chemical reaction process, causing the BARC layer 120 to transform from being hydrophobic to become hydrophilic.

For purposes of illustrations only, the BARC layer 120 may include one or more of the following hydrolyzable monomers:

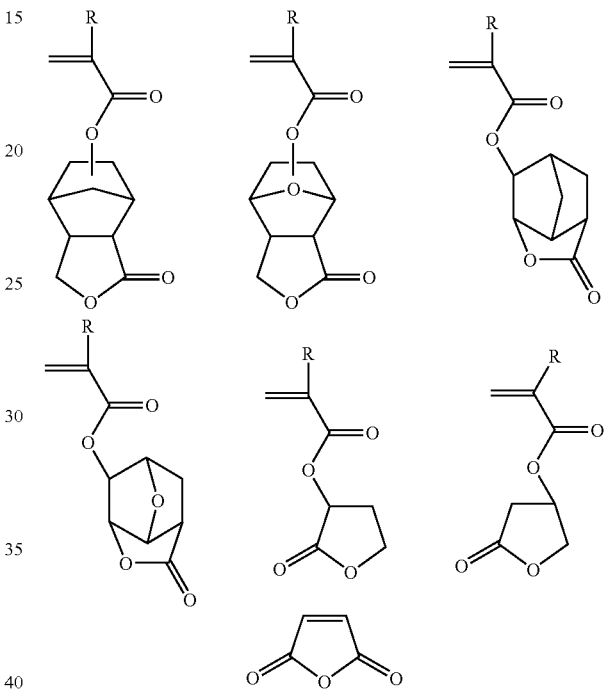

Alternatively or additionally, the BARC layer 120 may include one or more materials such as maleic ahhydride and acrylate copolymer, lactone derivative and acrylate copolymer as illustrated below:

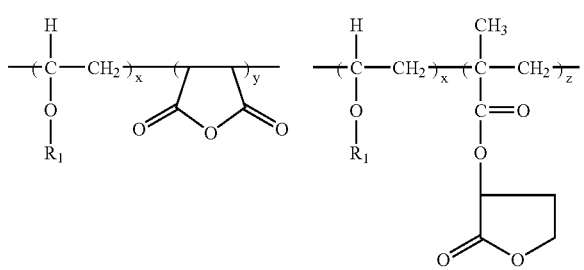

In another example, the BARC layer 120 may include a photo acid generator (not shown), and may include at least one acid-deprotectable functional group that may be catalyzed to become hydrophilic by an acid. As described below, during the post-exposure baking process, the photo acid generator produces an acid that causes the BARC layer 120 to become hydrophilic. The photo acid generator may include components such as aryl onium salts (triarylsulfoniums or diaryliodoniums), thiophene, or any other suitable component.

For illustration purposes only, the BARC layer 120 may include the following acid-deprotectable functional group.

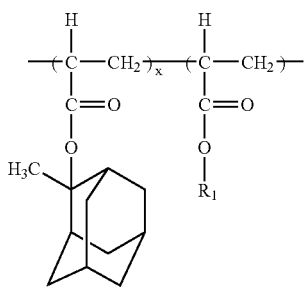

Figure 3:
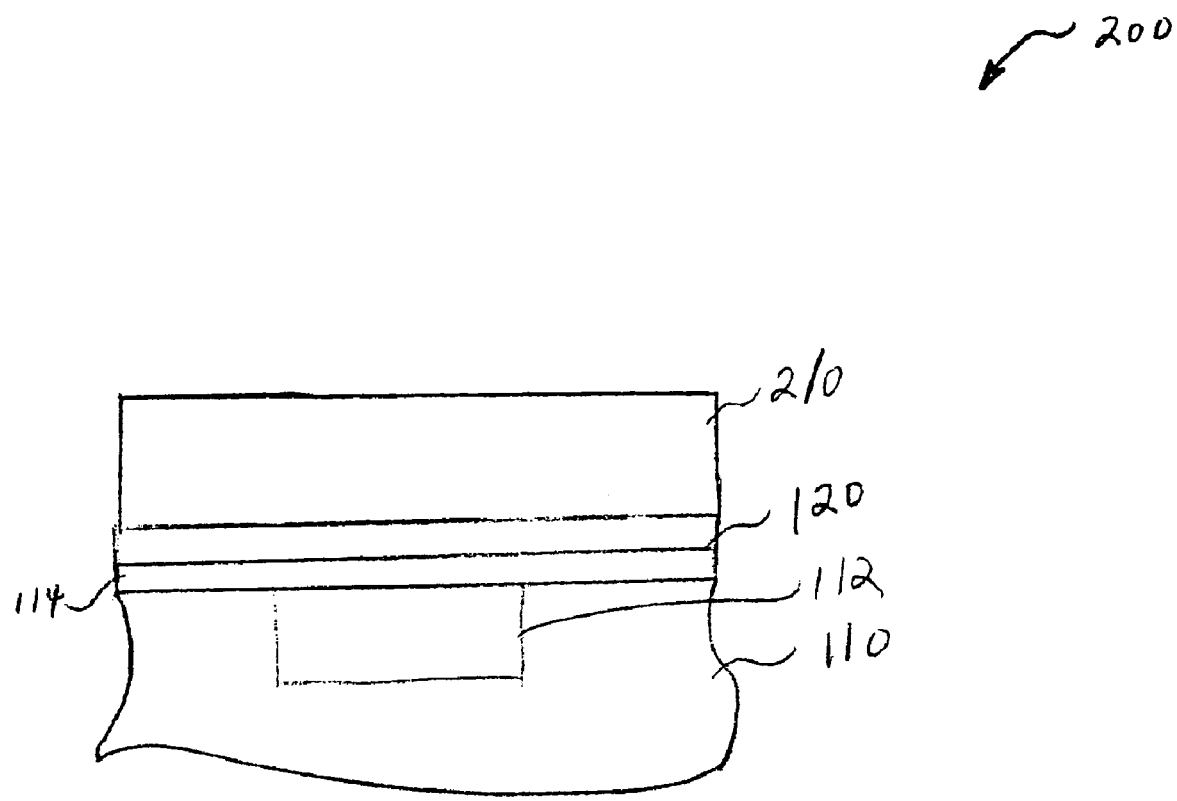
FIG. 3 is another partial semiconductor device for implementing one or more embodiments of the present invention.

Referring now to FIG. 3, in one embodiment, pursuant to step 16 of the method 10, a photoresist layer 210 may be deposited over the BARC layer 120. The photoresist layer 210 may be formed by spin coating and/or other processes. In operation, a photoresist solution is dispensed onto the surface of the BARC layer 120, and the partial semiconductor device 200 is spun rapidly until the photoresist solution is almost dry.

In one example, the photoresist layer 210 may be a chemically amplified resist that employs acid catalysis. In that case, the photoresist layer 210 may be formulated by dissolving an acid sensitive polymer and a photo acid generator (not shown) in a casting solution. The photo acid generator may include materials such as aryl onium salts (triarylsulfoniums or diaryliodoniums), thiophene, or any other suitable material. As described below, when the photoresist layer 210 is exposed to radiation during the post-exposure baking process, the photo acid generator produces an acid that causes the BARC layer 120 to become hydrophilic.

Following the deposition of the photoresist layer 122, the partial semiconductor device 200 may undergo a soft-bake (also known as pre-bake or post-apply bake) process to prepare the photoresist layer 210 for the next step of exposure.

During exposure, the partial semiconductor 200 is exposed to radiation (not shown) by methods known in the art to create a latent image in the photoresist layer 210.

Following exposure, a post-exposure baking process (not shown) is applied to the partial semiconductor device 200, causing photoactive compounds to diffuse thorough the exposed region of the photoresist layer 210.

Step 18 of the method 10 will now be further described. In one embodiment, during the post-exposure baking process, the photo acid generator residing within the BARC layer 120 and/or the photoresist layer 210 generates an acid, which may contain H⁺ or any other suitable component. The acid causes chemical reaction in the BARC layer 120 by generating an OH group, and thus prompts the BARC layer 120 to become hydrophilic. An exemplary transformation of the BARC layer 120 is illustrated as follows:

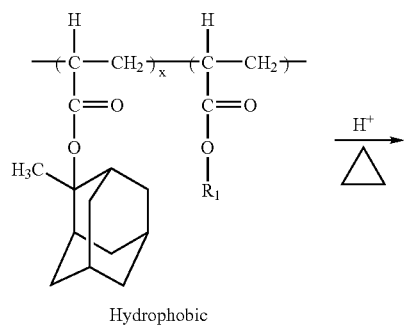

Hydrophobic

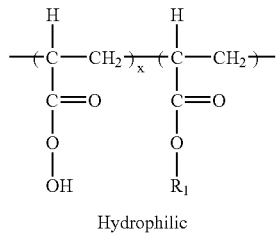

Hydrophilic

Alternatively, the BARC layer 120 may remain hydrophobic at this time, and may be become hydrophilic during the development process described below.

Following the post-exposure baking step, a development process is applied to the partial semiconductor device 200 to turn a latent image in the photoresist layer 210 into a final image. During that process, a developer, which may be alkaline solutions diluted with water, or any other suitable substance known in the art, may be utilized to immerse, spray or puddle develop the partial semiconductor device 200.

In one example, assuming that the BARC layer 120 is still hydrophobic at the development stage, the developer or the base (which may be substantially contained in the developer) may catalyze the BARC layer to produce an OH group, and cause the BARC layer 120 to become hydrophilic. Two exemplary transformations of the BARC layer 120 are illustrated as follows:

Thereafter, additional steps are adopted for forming a complete semiconductor device. Since those additional steps are known in the art, they will not be further described herein.

It is noted that many variations of the above example are contemplated herein. In one example, the transformation of the BARC layer 120 may occur prior to or at the exposure stage. In another example, the transformation of the BARC layer 120 may occur after the development process. In a third example, the transformation may be applied to a TARC layer. Therefore, a variety of modifications is contemplated by this disclosure.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A partial semiconductor device, comprising:
a substrate;
an anti-reflective coating (ARC) layer over the substrate; and
a photoresist layer over the substrate, wherein the ARC layer includes a polarity changeable substance such that the ARC layer is transformed from being hydrophobic to being hydrophilic during a lithography process with the photoresist layer, and wherein the ARC layer comprises an acid-deprotectable functional group, wherein the acid-deprotectable functional group comprises:

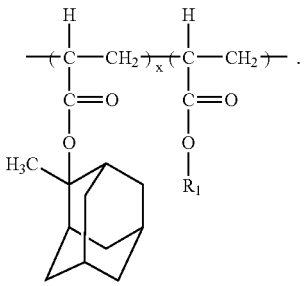

2. A partial semiconductor device, comprising:
a substrate;
an anti-reflective coating (ARC) layer over the substrate; and
a photoresist layer over the substrate, wherein the ARC layer includes a polarity changeable substance such that the ARC layer is transformed from being hydrophobic to being hydrophilic during a lithography process with the photoresist layer, wherein the transformation of the ARC layers is as follows:

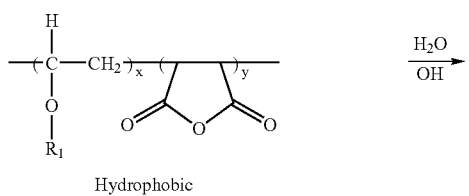

Hydrophobic

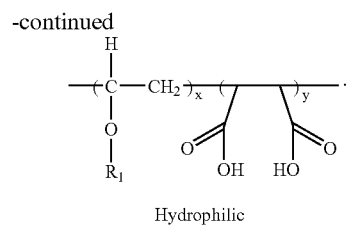

Hydrophilic

3. A partial semiconductor device, comprising:
a substrate;
an anti-reflective coating (ARC) layer over the substrate; and
a photoresist layer over the substrate, wherein the ARC layer includes a polarity changeable substance such that the ARC layer is transformed from being hydrophobic to being hydrophilic during a lithography process with the photoresist layer, wherein the transformation of the ARC layers is as follows:

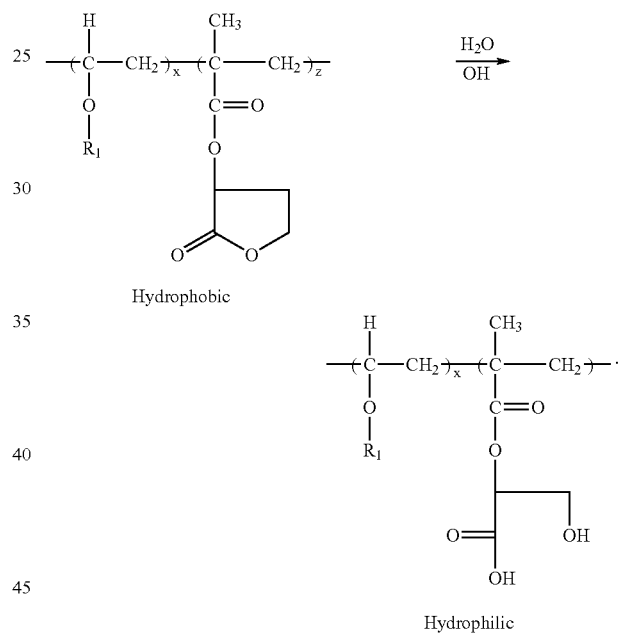

4. A method for forming a semiconductor device, comprising:
providing a substrate;
providing an anti-reflective coating (ARC) layer over the substrate wherein the ARC layer is hydrophobic prior to an exposure process, wherein the ARC layer comprises a polarity changeable substance;
providing a photoresist layer over the substrate; and
causing the ARC layer to transform from being hydrophobic to being hydrophilic during a lithography process with the photoresist layer.

5. The method of claim 4 wherein the transformation occurs no earlier than the exposure process.

6. The method of claim 4 wherein the transformation occurs during a post-exposure baking (PEB) process.

7. The method claim 4 wherein the transformation occurs during a development process.

8. The method claim 4 wherein the transformation is catalyzed by a base.

9. The method claim 8 wherein the base is substantially contained in a developer.

10. The method of claim 4 wherein at least one acid produced by a photo acid generator (PAG) catalyzes the ARC layer to become hydrophilic.

11. The method of claim 4 wherein at least one the ARC layer comprises an acid-deprotectable functional group.

12. The method of claim 4 wherein the ARC layer comprises a lactone derivative.

13. The method of claim 4 wherein the ARC layer comprises maleic anhydride.

* * * * *